United States Patent
Yun et al.

(10) Patent No.: US 11,728,293 B2
(45) Date of Patent: Aug. 15, 2023

(54) CHIP MODULES EMPLOYING CONDUCTIVE PILLARS TO COUPLE A PASSIVE COMPONENT DEVICE TO CONDUCTIVE TRACES IN A METALLIZATION STRUCTURE TO FORM A PASSIVE COMPONENT

(71) Applicant: QUALCOMM Incorporated, San Diego, CA (US)

(72) Inventors: Changhan Hobie Yun, San Diego, CA (US); Daniel Daeik Kim, San Diego, CA (US); Paragkumar Ajaybhai Thadesar, San Diego, CA (US); Nosun Park, Incheon (KR); Sameer Sunil Vadhavkar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 261 days.

(21) Appl. No.: 17/166,430

(22) Filed: Feb. 3, 2021

(65) Prior Publication Data

US 2022/0246552 A1    Aug. 4, 2022

(51) Int. Cl.
*H01L 23/64* (2006.01)
*H01L 23/66* (2006.01)
*H01L 49/02* (2006.01)

(52) U.S. Cl.
CPC ............ *H01L 23/66* (2013.01); *H01L 23/645* (2013.01); *H01L 28/10* (2013.01)

(58) Field of Classification Search
CPC ........ H01L 23/66; H01L 23/645; H01L 28/10
See application file for complete search history.

(56) References Cited

U.S. PATENT DOCUMENTS

| 10,433,425 | B1 | 10/2019 | Liu et al. |
| 10,553,671 | B2 | 2/2020 | Zuo et al. |
| 10,693,432 | B2 | 6/2020 | Park et al. |
| 2007/0268105 | A1 | 11/2007 | Walls |
| 2009/0085704 | A1 | 4/2009 | Theuss |

(Continued)

OTHER PUBLICATIONS

International Search Report and Written Opinion for International Patent Application No. PCT/US2022/070429, dated May 24, 2022, 17 pages.

*Primary Examiner* — Samuel A Gebremariam
(74) *Attorney, Agent, or Firm* — W&T

(57) ABSTRACT

Mobile phones and other mobile devices communicate wirelessly by transmitting and receiving RF signals. Transmitters and receivers in wireless devices process RF signals in certain frequency ranges or bands. Signals in other frequencies can be blocked or filtered out by, for example, a lumped-element circuit or a lumped-element filter consisting of passive electrical components such as inductors, capacitors, and resistors. A passive component device, or integrated passive device, is one example of a lumped-element filter fabricated with passive components on a die. In a mobile device, a passive component device and one or more integrated circuits or other chips used for signal processing are interconnected by being mounted on (i.e., coupled to) a metallization structure or package substrate in a chip module or multi-chip module. The demand for miniaturization of hand-held mobile devices drives a need for reducing the sizes of chip modules that are inside a mobile device.

14 Claims, 9 Drawing Sheets

(56) References Cited

U.S. PATENT DOCUMENTS

| | | |
|---|---|---|
| 2015/0187488 A1 | 7/2015 | Williams et al. |
| 2015/0282308 A1 | 10/2015 | Meyer et al. |
| 2015/0311271 A1 | 10/2015 | Erturk et al. |
| 2017/0077079 A1 | 3/2017 | Lan et al. |
| 2017/0250133 A1 | 8/2017 | Sturcken et al. |
| 2017/0338034 A1* | 11/2017 | Yun ........................ H03H 7/466 |
| 2019/0164905 A1* | 5/2019 | Hsieh .................... H01L 23/552 |

* cited by examiner

CHIP MODULES EMPLOYING CONDUCTIVE PILLARS TO COUPLE A PASSIVE COMPONENT DEVICE TO CONDUCTIVE TRACES IN A METALLIZATION STRUCTURE TO FORM A PASSIVE COMPONENT

BACKGROUND

I. Field of the Disclosure

The field of the disclosure relates generally to chip modules, including multi-chip modules (MCMs), and more particularly to reducing an area of a passive component device radio-frequency (RF) filter in a chip module.

II. Background

A lumped-element filter is an electric circuit that blocks or allows the passage of radio-frequency (RF) signals of selected frequency ranges in electronic devices for RF telecommunication. A lumped-element filter includes passive components, such as inductors, capacitors, and/or resistors, that may be formed among interconnect layers on a substrate in a passive component device or die. A passive component device, also known as an integrated passive device, is a flip-chip type device in which passive components are formed from metal traces in one or more interconnect layers in a dielectric structure disposed on one side of a substrate in a back-end of line (BEOL) process. One example of a passive component device is a passive-on-glass (POG) device that includes a glass substrate to provide enhanced electrical isolation. A metal-insulator-metal (MIM) capacitor is one example of a passive component that can be formed in a passive component device by forming metal traces adjacent to each other in different interconnect layers of the passive component device. In another example, an inductor can be formed in a passive component device as a two-dimensional (2D) (e.g., horizontal) spiral or helix metal trace in one interconnect layer of the dielectric structure. As another example, a three-dimensional (3D) inductor may be formed in a passive component device by metal traces in multiple dielectric layers of the dielectric structure with vias disposed through the dielectric structure to electrically couple the metal traces together in a 3D coil. A passive component device can be packaged with external interconnects (e.g., solder bumps) and electrically coupled to a supporting metallization structure (e.g., package substrate with redistribution layers to integrate the passive component device into a circuit.

Passive component devices are often employed in a chip module such as an RF front-end chip module used in a telecommunications device. In response to a demand for smaller and cheaper electronic devices, there is a motivation to reduce the size of chip modules, including those employing POG devices such as RF front-end chip modules.

SUMMARY OF THE DISCLOSURE

Aspects disclosed herein include chip modules employing conductive pillars to couple a passive component device to conductive traces in a metallization structure to form a passive component. An exemplary chip module includes a plurality of conductive pillars coupling a conductive trace of a passive component device and a conductive trace of a metallization structure to form a passive component extending between the metallization structure and the passive component device. The conductive traces may be at any interconnect layer within the passive component device and at any redistribution layer of the metallization structure. The passive component makes use of a region of the chip module between the passive component device and the metallization structure rather than consuming space in the passive component device. Due to the conductive pillars having a smaller center-to-center distance compared to the solder bumps, an area occupied by the passive component can be reduced. The conductive pillars are also a lower resistance connection than the solder bumps.

As an example of a passive component, a three-dimensional (3D) inductor comprising a core region between the metallization structure and the passive component device can be formed by employing conductive pillars to couple conductive traces of the passive component device and the metallization structure. The height of a cross-section of the core region as a result of employing the conductive pillars provides increased inductance. A smaller center-to-center distance between the conductive pillars increases coil density to provide an inductance in a smaller area. The low resistance of the conductive pillars provides a higher Q value in the 3D inductor. Integrating passive components into a region including the passive component device, the metallization structure, and a region between the passive component device and metallization structure reduces an area of a chip module such as a radio-frequency (RF) front-end module.

In this regard, in one exemplary aspect, a chip module is disclosed. The chip module includes a metallization structure including a first conductive trace. The chip module also includes a passive component device. The passive component device includes a dielectric structure disposed adjacent to a substrate. The passive component device also includes a second conductive trace disposed in the dielectric structure. The chip module also includes a passive component including at least one conductive pillar coupled to the first conductive trace and to the second conductive trace.

In another exemplary aspect, a multi-chip module (MCM) is disclosed. The MCM includes a passive component device. The passive component device includes a dielectric structure disposed on a substrate. The passive component device also includes a first conductive trace disposed in the dielectric structure. The MCM also includes a metallization structure including a second conductive trace. The MCM also includes a passive component including at least one conductive pillar coupled to the first conductive trace and to the second conductive trace. The MCM also includes an integrated circuit (IC) die coupled to the metallization structure and the passive component.

In another exemplary aspect, a method is disclosed. The method includes forming a metallization structure including a first conductive trace. The method also includes forming a passive component device. The passive component device includes a dielectric structure disposed adjacent to a substrate. The passive component device also includes a second conductive trace disposed in the dielectric structure. The method also includes forming a passive component comprising at least one conductive pillar coupled to the first conductive trace and to the second conductive trace.

DETAILED DESCRIPTION

Figure 1A:
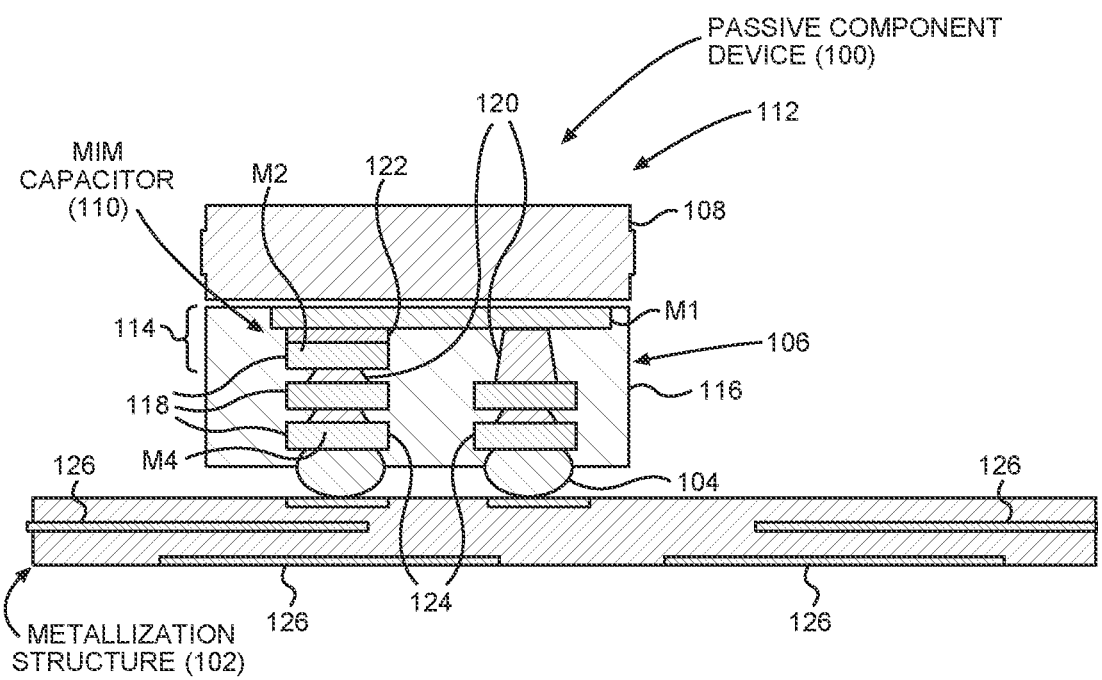
FIG. 1A is a cross-sectional side view of a passive component device coupled to a surface of a metallization structure by solder bumps.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include chip modules employing conductive pillars to couple a passive component device to conductive traces in a metallization structure to form a passive component. An exemplary chip module includes a plurality of conductive pillars coupling a conductive trace of a passive component device and a conductive trace of a metallization structure to form a passive component extending between the metallization structure and the passive component device. The conductive traces may be at any interconnect layer within the passive component device and at any redistribution layer of the metallization structure. The passive component makes use of a region of the chip module between the passive component device and the metallization structure rather than consuming space in the passive component device. Due to the conductive pillars having a smaller center-to-center distance compared to the solder bumps, an area occupied by the passive component can be reduced. The conductive pillars are also a lower resistance connection than the solder bumps.

Mobile phones and other mobile devices communicate wirelessly by transmitting and receiving RF signals. Transmitters and receivers in wireless devices process RF signals in certain frequency ranges or bands. Signals in other frequencies can be blocked or filtered out by, for example, a lumped-element circuit or a lumped-element filter consisting of passive electrical components such as inductors, capacitors, and resistors. A passive component device, or integrated passive device, is one example of a lumped-element filter fabricated with passive components on a die. In a mobile device, a passive component device and one or more integrated circuits (ICs) or other chips used for signal processing are interconnected by being mounted on (i.e., physically and electrically coupled to) a metallization structure or package substrate in a chip module or multi-chip module (MCM). The demand for miniaturization of handheld mobile devices drives a need for reducing the sizes of chip modules that are inside a mobile device. The size of a chip module can be reduced by reducing the sizes of components therein, and/or more efficiently integrating the internal components in the space of the chip module.

FIG. 1A is a cross-sectional side view of a passive component device 100 coupled to a metallization structure 102 by solder bumps 104. The passive component device 100 includes a dielectric structure 106 formed on one side of a substrate 108 of an insulating material. The passive component device 100 includes passive components, such as a metal-insulator-metal (MIM) capacitor 110, formed in the dielectric structure 106. The passive component device 100 may also be referred to as a passive-on-glass (POG) device 112 if the substrate 108 is formed of glass. The passive component device 100 is mounted on the metallization structure 102 in a flip-chip method.

The dielectric structure 106 includes a plurality of interconnect layers 114 separated from each other by a dielectric material 116. A plurality of conductive (e.g., metal) traces 118 are formed at each interconnect layer 114, and the conductive traces 118 of different interconnect layers 114 can be connected by vertical interconnect accesses (vias) 120. The MIM capacitor 110 is formed from a dielectric layer 122 disposed between conductive traces 118 in a first interconnect layer (M1) and a second interconnect layer (M2). The passive component device 100 is electrically coupled and physically mounted to the metallization structure 102 by the solder bumps 104. Portions of the dielectric material 116 are removed to expose contacts 124 in the top interconnect layer 114 (e.g., M4) of the dielectric structure 106, and the solder bumps 104 are formed on the contacts 124. The solder bumps 104 can be electrically coupled to conductive traces 126 in the metallization structure 102 to provide electrical connection between the passive component device 100 and other circuits (not shown) coupled to the metallization structure 102, such as an IC including an amplifier or other circuit for signal processing.

Figure 1B:
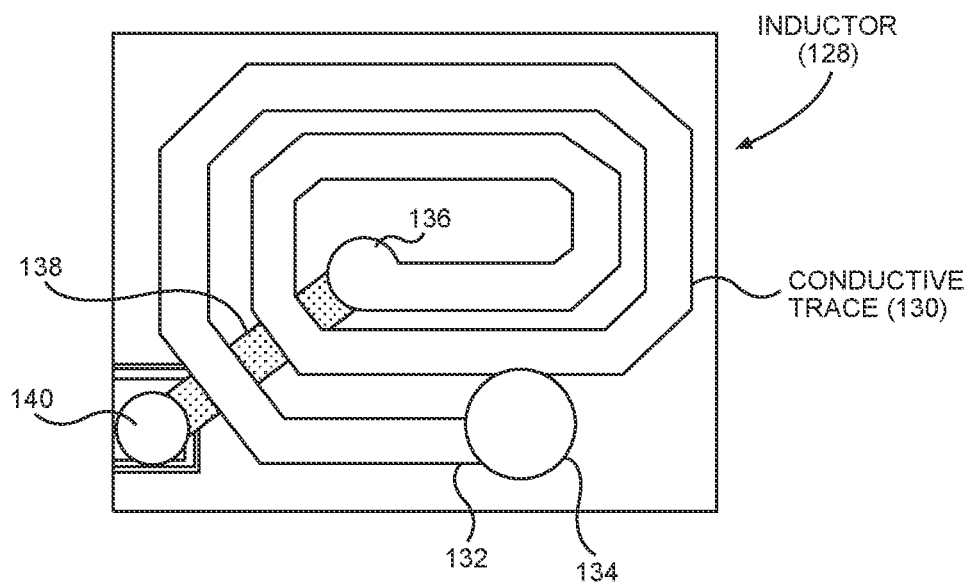
FIG. 1B is a top plan view of a two-dimensional (2D) spiral inductor formed in a first interconnect layer in the passive component device of FIG. 1A including an underpass connection to a second interconnect layer.

The passive component device 100 also includes an inductor 128, as shown in a top plan view in FIG. 1B. The inductor 128 is formed as a two-dimensional (2D) spiral or helix shape in a conductive trace 130 in one of the interconnect layers 114. A first end 132 of the spiral- or helix-shaped conductive trace 130 is coupled to a first contact 134. The second end 136 inside the spiral-shaped conductive trace 130 is coupled to an "underpass" 138 which leads to a second contact 140, to which the underpass 138 is connected by a via (not shown). Thus, the inductor 128 is predominantly formed in a single interconnect layer 114 but also requires a conductive trace (e.g., underpass 138) in another interconnect layer 114. While an inductor 128 may be sufficient for some applications, for low-band frequencies (e.g., below 2 gigahertz (GHz)), a higher inductance is required. To fabricate a higher-inductance inductor of a single-layer helix (i.e., 2D) such as the inductor 128 would require a larger area of the interconnect layer 114, increasing the size of the passive component device 100, which is counter to the desire for miniaturization. Thus, a different solution for creating a high-inductance inductor in a chip module is needed.

Figure 2:
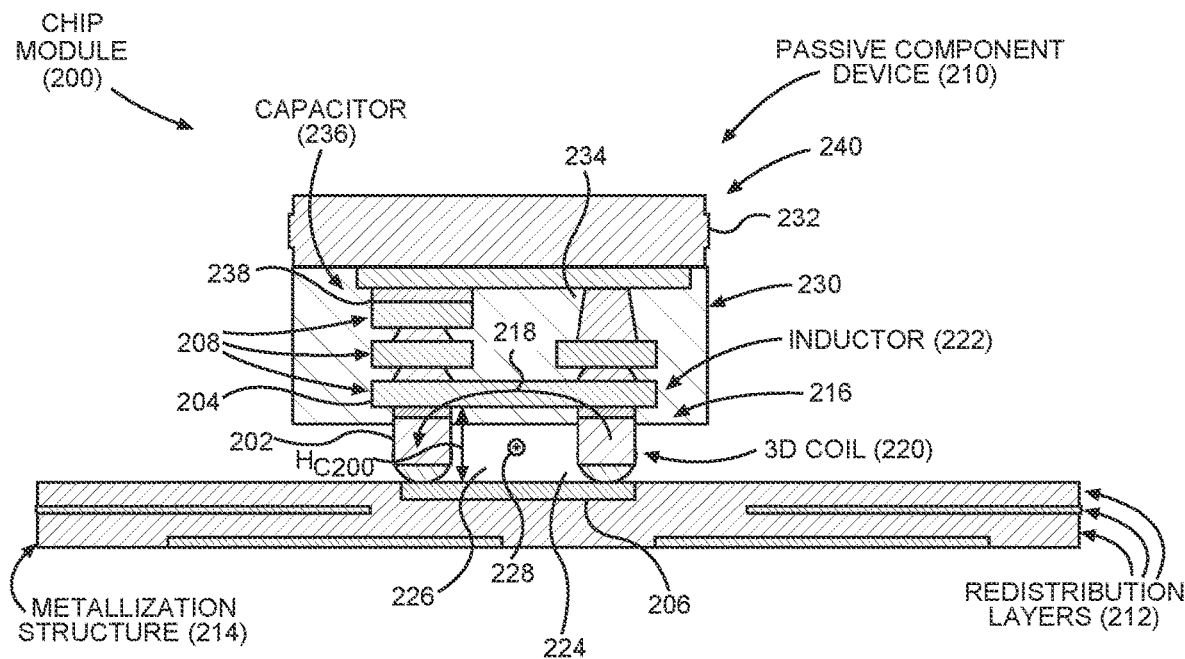
FIG. 2 is a cross-sectional side view of an exemplary chip module including a plurality of conductive pillars serially coupling at least one conductive trace in an interconnect layer of a passive component device and at least one conductive trace of a redistribution layer of a metallization structure to form a high-density three-dimensional (3D) coil of an inductor with a core region between the metallization structure and the passive component device.

FIG. 2 is a cross-sectional side view of an exemplary chip module 200 that includes a plurality of conductive pillars 202 coupling at least one conductive trace 204 of a first plurality of conductive traces 204 to at least one conductive trace 206 of a second plurality of conductive traces 206. The at least one conductive trace 204 is in an interconnect layer 208 a plurality of interconnect layers 208 of a passive component device 210, and the at least one conductive trace 206 is in a redistribution layer 212 of a metallization structure 214. A passive component 216 is formed by one of the conductive traces 204, one of the conductive traces 206, and at least one of the conductive pillars 202 coupled in series. In an example, these serially-connected elements form one complete revolution or turn 218 of a 3D coil 220 to form an inductor 222. Additional conductive pillars 202 serially coupling additional conductive traces 204 to additional conductive traces 206 can form additional turns 218 of the 3D coil 220 for higher inductance.

In this regard, the inductor 222 provided by the 3D coil 220 can have a high inductance while efficiently taking advantage of an otherwise unused region of the chip module 200 between the passive component device 210 and the metallization structure. Here, the inductor 222 is formed partially within the passive component device 210, partially within the metallization structure 214, and partially in a space 224 between the passive component device 210 and the metallization structure 214. A core region 226 of the inductor 222 includes the space 224, which may be filled with any of air, a mold compound, or another underfill (not shown), for example. A height $H_{C200}$ of the core region 226 of the 3D coil 220 is a distance (e.g., at least 50 micrometers (μm)) extending between the conductive trace 206 in the metallization structure 214 and the conductive trace 204 in the passive component device 210. An axis 228 of the core region 226 extends between the passive component device 210 and the metallization structure 214, parallel to the metallization structure 214. The axis 228 extends in a direction orthogonal to the image in FIG. 2.

The interconnect layers 208 are formed in a dielectric structure 230 disposed adjacent to a substrate 232. An inductor of the same height $H_{C200}$ could not be formed within the interconnect layers 208 of the dielectric structure 230, because the height $H_{C200}$ is greater than a distance from the uppermost interconnect layer 208 to the lowermost interconnect layer 208. In this regard, the features in FIG. 2 are not drawn to scale. Since an inductance of the inductor 222 increases with height, the height $H_{C200}$ provided by employing the conductive pillars 202 in the space 224 between the passive component device 210 and the metallization structure 214 allows a higher-inductance inductor 222 to be formed within the chip module 200 without an increase in area. The dielectric structure 230 includes a dielectric material 234, which may be an organic dielectric, such as polyimide, between the interconnect layers 208. The dielectric structure 230 may also include a capacitor 236 (e.g., MIM capacitor) formed by disposing another capacitor dielectric material 238, which may be an inorganic dielectric (e.g., silicon nitride (SiN)) between two of the interconnect layers 208.

Regarding other materials used in the chip module 200, the interconnect layers 208, the redistribution layers 212, and the conductive pillars 202 may all be formed of a metal, such as copper, or another conductor. The substrate 232 may be an insulating glass material, such that the passive component device 210 may be a POG device 240.

Figure 3:
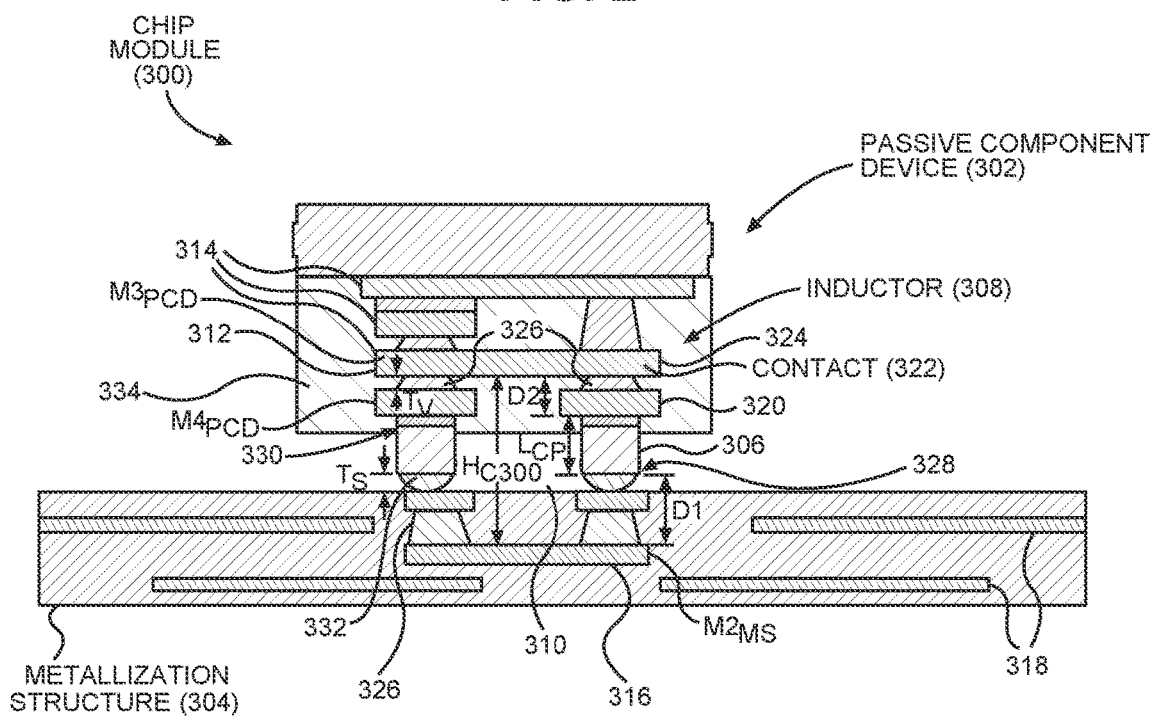
FIG. 3 is a cross-sectional side view of another exemplary chip module including a plurality of conductive pillars coupled to a first interconnect layer coupled by vias to another interconnect layer in the metallization structure to increase a height of the cross-sectional area of the core region of the 3D inductor.

FIG. 3 illustrates another exemplary chip module 300 including a passive component device 302 coupled to a metallization structure 304 by conductive pillars 306. An inductor 308 formed in the chip module 300 has a core region 310 with a height $H_{C300}$ extending between the passive component device 302 and the metallization structure 304. The height $H_{C300}$ is larger than the height $H_{C200}$ of the chip module 200. In the chip module 200, the conductive traces 204 of the passive component device 210 are in the lowest interconnect layer 208 (M4) (i.e., farthest from the substrate 232), and the conductive traces 206 are in the uppermost redistribution layer 212 of the metallization structure 214. In contrast, in the chip module 300 in FIG. 3, the height $H_{C300}$ of the core region 310 extends from a conductive trace 312 in the second lowest of interconnect layers 314 ($M3_{PCD}$) of the passive component device 302 to a conductive trace 316 in the second highest of redistribution layers 318 ($M2_{MS}$) of the metallization structure 304. The conductive pillars 306 in the chip module 300 are coupled to contact regions 320 in the lowest interconnect layer 314 ($M4_{PCD}$). The contact regions 320 are coupled to contacts 322 at ends 324 of the conductive traces 312 in the second lowest interconnect layer 314 ($M3_{PCD}$) by vias 326.

The height $H_{C300}$ of the core region 310 is a total distance from the conductive trace 312 at the top of the core region 310 to the conductive trace 316 at the bottom of the core region 310. Specifically, the height $H_{C300}$ includes a distance D1 from the first conductive trace 316 to a bottom end 328 of a conductive pillar 306, a length $L_{CP}$ of the conductive pillar 306, and a distance D2 from a top end 330 of the conductive pillar 306 to the second conductive trace 312. In one example, the length $L_{CP}$ of the conductive pillar 306 may be 40-80 μm. The distances D1 and D2 include a thickness $T_S$ of a solder connector 332 on the bottom end 328 and the top end 330 of the conductive pillar 306, and also a thickness $T_V$ of the vias 326. In an example, the thickness $T_S$ is between 16 and 24 μm and the thickness $T_V$ is between 4 and 6 μm (e.g., the distance between respective interconnect layers 314). Before coupling the passive component device 302 to the metallization structure 304, portions of dielectric material 334 are removed to expose the contact regions 320 in the lowest interconnect layer 314 ($M4_{PCD}$) and the conductive pillars 306 are formed on the contact regions 320. The conductive pillars 306 can be electrically coupled to conductive traces 316 in the metallization structure 304 to provide physical attachment and an electrical connection of the passive component device 302 and other circuits (not shown) coupled to the metallization structure 304. To further increase the height $H_{C300}$, the distances D1 and D2 could be increased by forming the inductor 308 with the conductive traces 312 in a higher one of the interconnect layers 314 and the conductive traces 316 in a lower one of the redistribution layers 318 and the addition of more vias 326.

Figure 4:
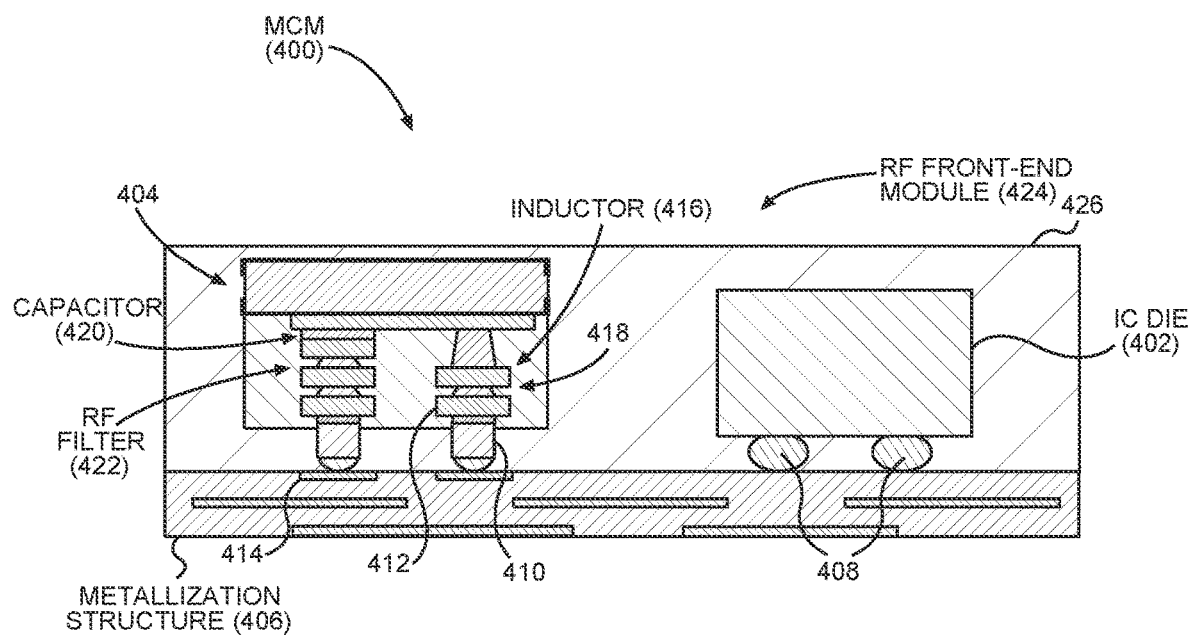
FIG. 4 is a cross-sectional side view of a multi-chip module (MCM) as an example of the chip module in FIG. 2 with an IC die coupled to the metallization structure.

FIG. 4 is a cross-sectional side view of a MCM 400 including an IC die 402 and a passive component device 404 on a metallization structure 406. In the example in FIG. 4, the IC die 402 is coupled to the metallization structure 406 by solder bumps 408 in a flip-chip method. At least one conductive pillar 410 couples a first conductive trace 412 of a first plurality of conductive traces 412 of the passive component device 404 to a second conductive trace 414 of a second plurality of conductive traces 414 of the metallization structure 406 to form an inductor 416. As previously discussed, the inductor 416 is provided as a coil 418 formed from the conductive pillars 410, conductive traces 412, and conductive traces 414. The passive component device 404 also includes a capacitor 420 which, together with the inductor 416 and other passive components (not shown), forms a lumped-component filter ("RF filter 422") electrically coupled to a circuit in the IC die 402. Thus, the IC die 402 includes an RF circuit (not shown) coupled to at least one of the inductor 416 and the capacitor 420. The MCM 400 may be an RF front-end module 424 in which the IC die 402, the passive component device 404, and, optionally, other chips or devices are encased in a molding compound 426.

Figure 5:
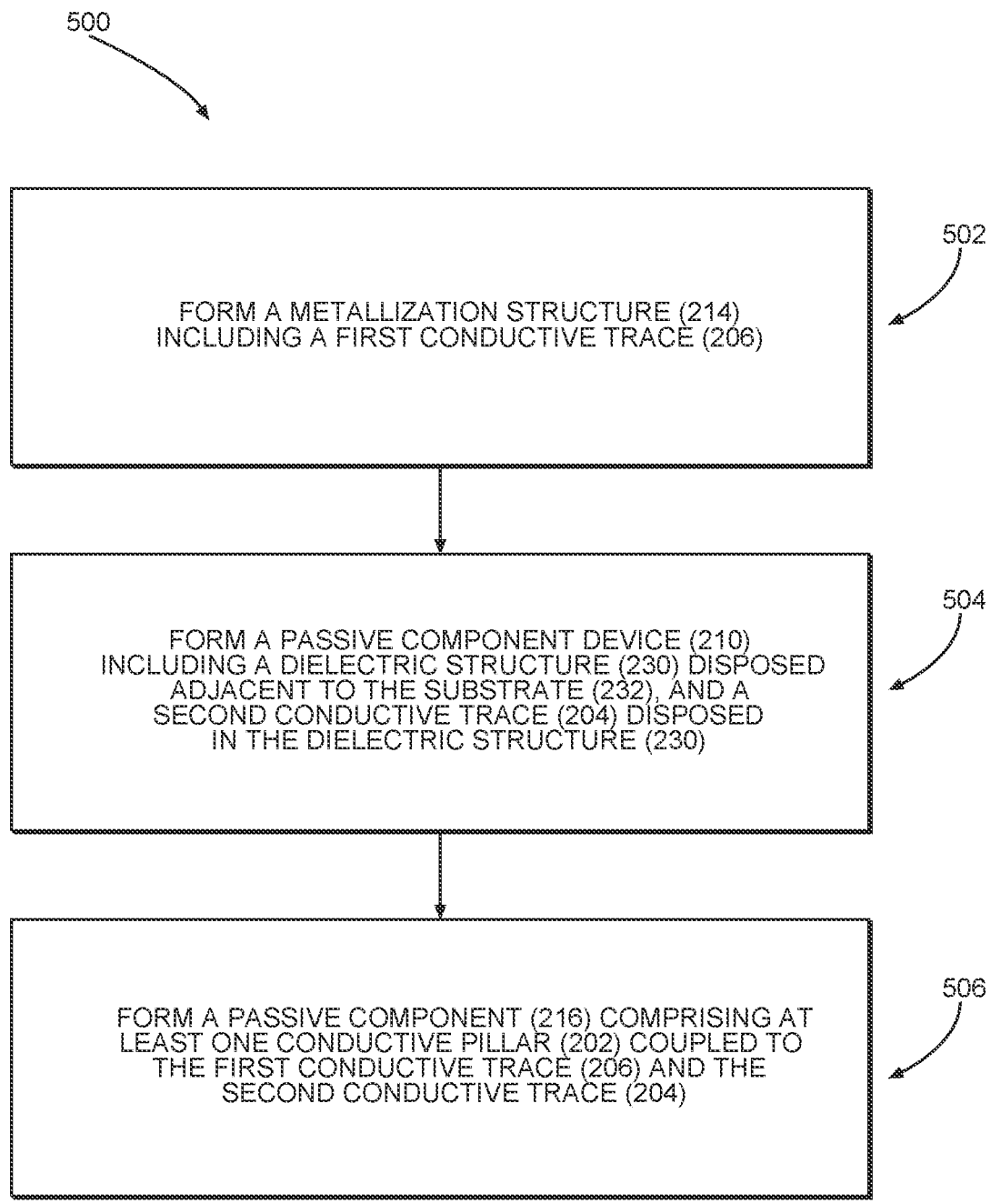
FIG. 5 is a flowchart of a method of fabricating the exemplary chip modules illustrated in FIGS. 2-4.

FIG. 5 is a flowchart illustrating a method 500 of forming a chip module 200 as in the example shown in FIG. 2. The method includes forming a metallization structure 214 including a first conductive trace 206 (block 502). The method 500 also includes forming a passive component device 210 including a dielectric structure 230 disposed adjacent to the substrate 232, and a second conductive trace 204 disposed in the dielectric structure 230 (block 504). The method 500 further includes forming a passive component 216 comprising at least one conductive pillar 202 coupled to the first conductive trace and to the second conductive trace 204 (block 506).

Figure 6:
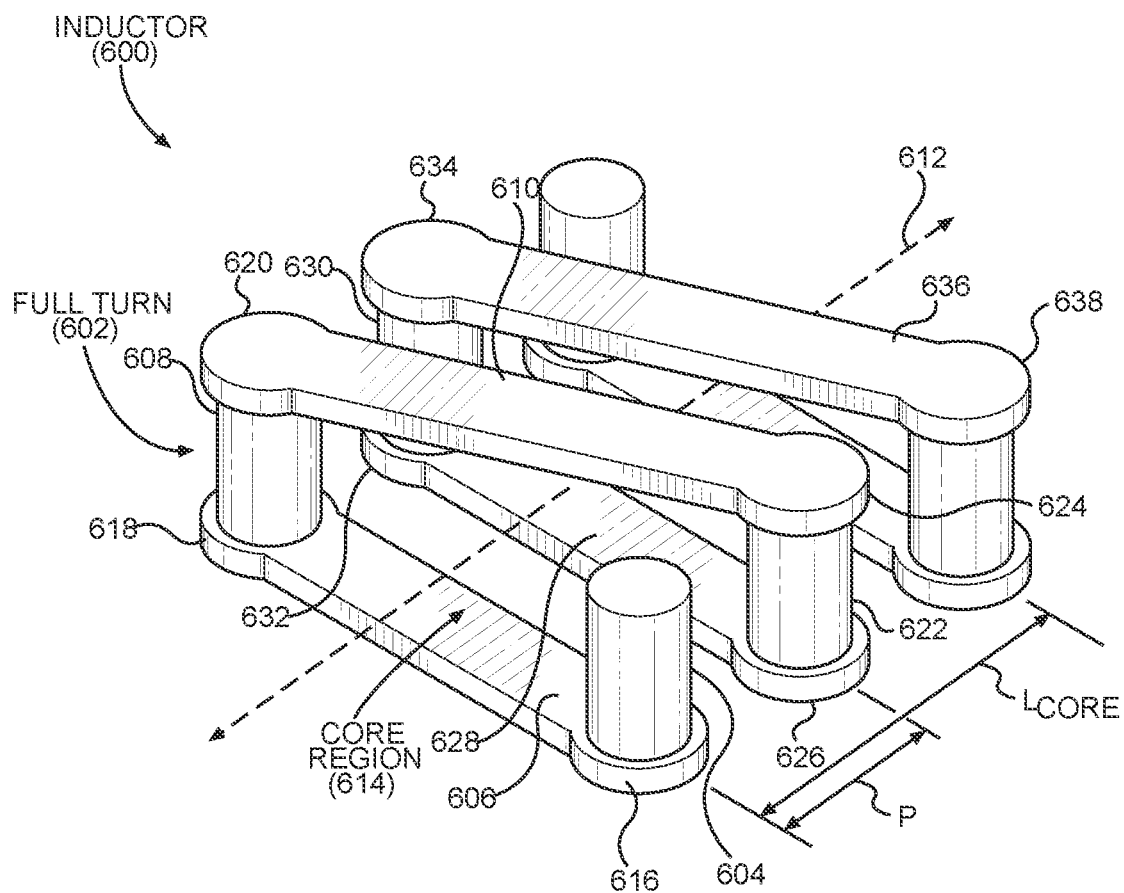
FIG. 6 is a perspective view illustrating a turn of a coil of the 3D inductor in FIG. 2 formed by conductive pillars serially coupling conductive traces in an interconnect layer of a passive component device and a conductive trace of a metallization structure.

A perspective view of a 3D inductor 600 ("inductor 600") in FIG. 6 illustrates an example of any of the inductors 222, 308, 416 in FIGS. 2-4. In FIG. 6, one full turn 602 of the inductor 600 is formed by a first conductive pillar 604, a first conductive trace 606, a second conductive pillar 608, and a second conductive trace 610. A full turn 602 is defined as a complete revolution around a core axis 612 of a core region 614 of the inductor 600. Although not apparent in the cross-sectional side views of FIGS. 2-4, the turns 602 of the inductor 600 do not form closed loops but instead form a spiral turn 602 around the core region 614. In particular, the inductor 600 includes the first conductive pillar 604 coupled to a first contact 616 of the first conductive trace 606. The second conductive pillar 608 is coupled to a second contact 618 of the first conductive trace 606 and also to a third contact 620 of the second conductive trace 610. The inductor 600 continues with a third conductive pillar 622 coupled to a fourth contact 624 of the second conductive trace 610 and a fifth contact 626 of a third conductive trace 628. A fourth conductive pillar 630 is coupled between a sixth contact 632 of the third conductive trace 628 and a seventh contact 634 of a fourth conductive trace 636. The fourth conductive trace 636 extends to an eighth contact 638 from which additional turns 602 of the inductor 600 can continue.

A larger inductance can be achieved by continuing the inductor 600 with additional turns 602 around the core region 614. However, adding more turns 602 increases a length $L_{CORE}$ of the inductor 600 along the core axis 612, which could cause an increase in the area of a passive component device and a chip module. To minimize the length $L_{CORE}$ for a given number of turns 602, a center-to-center distance P (e.g., between the first conductive pillar 604 and the third conductive pillar 622) should also be minimized. The minimum center-to-center distance P (e.g., 100 μm) of the conductive pillars 604, 622 is smaller than a minimum center-to-center distance (e.g., >>102 μm) that can be achieved with the solder bumps 408 in FIG. 4. Consequently, the turns 602 of the inductor 600, which are separated by the distance P between the conductive pillars 604 and 622, are closer together than they would be if the inductor 600 was formed with the solder bumps 408.

The conductive pillars 604, 608 are also less expensive than the solder bumps 408, which require a gold contact layer. Additionally, the conductive pillars 604, 608 are formed of a highly-conductive metal, such as copper, which has lower resistivity than solder compounds. In view of the above factors, an inductor 600 formed by the conductive pillars 604, 608 as shown in FIG. 6 would have a higher density along the core axis 612 than if the conductive pillars 604, 608 were replaced with the solder bumps 408. For the reasons discussed above, the inductor 600 with conductive pillars 604, 608 would also be less expensive and have a higher Q value than if the conductive pillars 604, 608 were replaced with the solder bumps 408.

Figure 7A:
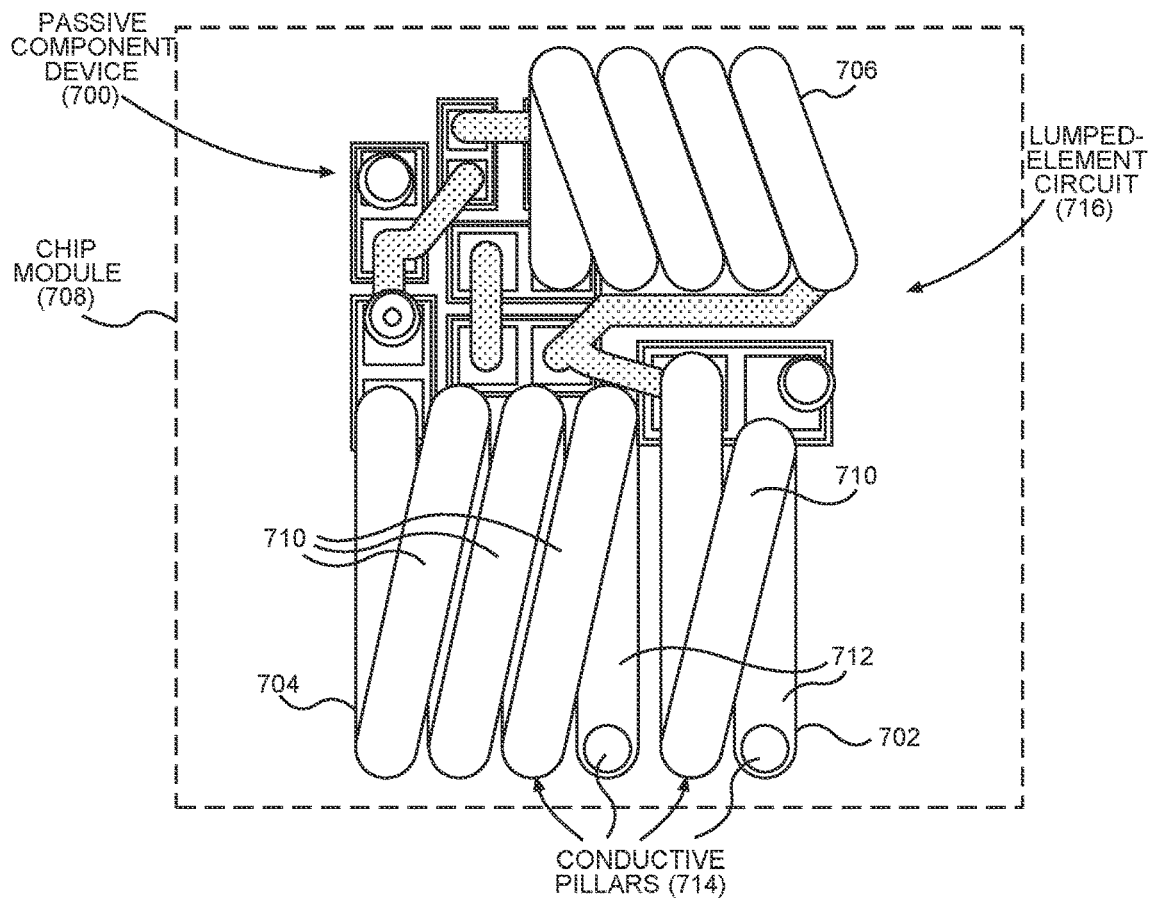
FIG. 7A is a plan view of a plurality of 3D inductors in an exemplary chip module from a bottom perspective showing only the conductive traces of the metallization structure serially coupled with conductive traces in the passive component device to form a passive component filter.

FIG. 7A is a plan view from below of an example of a passive component device 700 and a plurality of inductors 702, 704, and 706 in a chip module 708. Conductive traces 710 are the only visible features of a metallization structure that is otherwise not shown in FIG. 7. Conductive traces 712 are formed in a dielectric structure (otherwise not shown) of the passive component device 700, as described above. The conductive traces 710 are coupled to the conductive traces 712 by conductive pillars 714. The plurality of inductors 702, 704, and 706 are all included in a lumped-element circuit 716 in the passive component device 700. The inductors 702 and 704 are positioned in alignment and in close proximity to cause constructive coupling. In this regard, forming the plurality of inductors 702, 704, and 706 with conductive pillars 714 coupling the conductive traces 710 and the conductive traces 712 provides a high inductance that could be used in a lumped-component filter for filtering sub 2 GHz RF frequencies in a small mobile device.

Figure 7B:
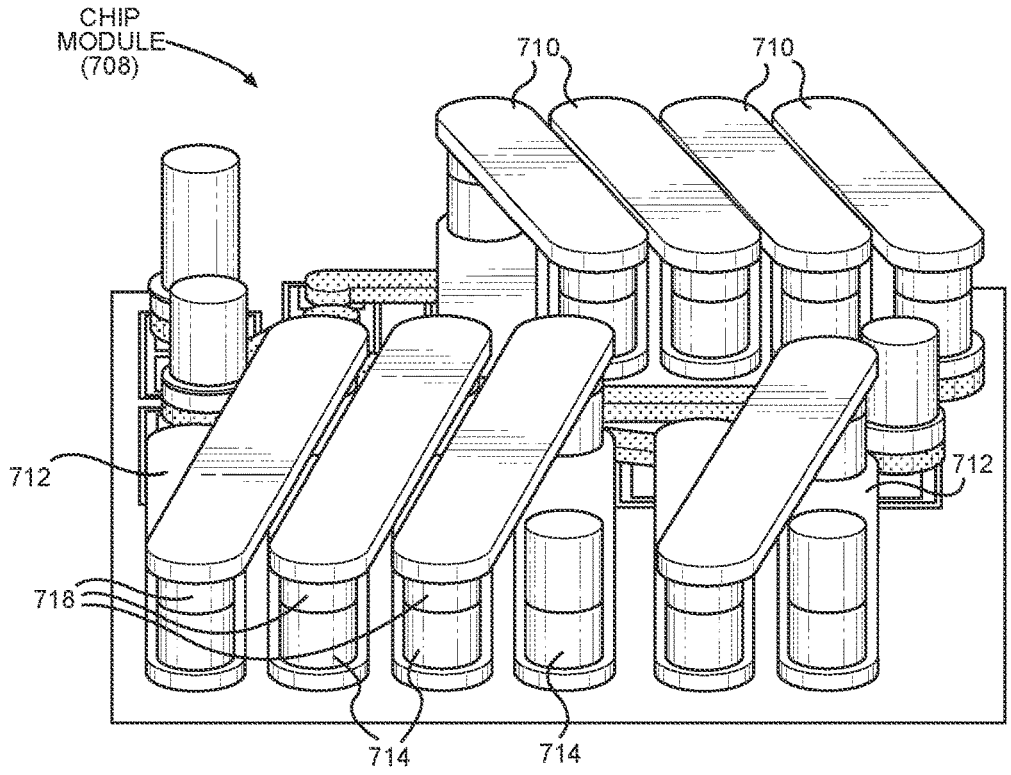
FIG. 7B is a perspective side view of the exemplary chip in FIG. 6A more clearly illustrating the plurality of conductive pillars serially coupling the conductive traces in the metallization structure and the conductive traces in the passive component device to form coils of a plurality of 3D inductors.

FIG. 7B is a perspective view of the chip module 708 in FIG. 7A provided to more clearly show the conductive pillars 714 coupling the conductive traces 710 and 712. As shown, each of the conductive pillars 714 is coupled to the conductive traces 710 of the metallization structure by a solder joint 718. Forming the conductive pillars 714 directly on the conductive traces 712 during fabrication of the passive component device 700 eliminates the need for a solder joint 718 between the conductive pillars 714 and the conductive traces 712.

Figure 8:
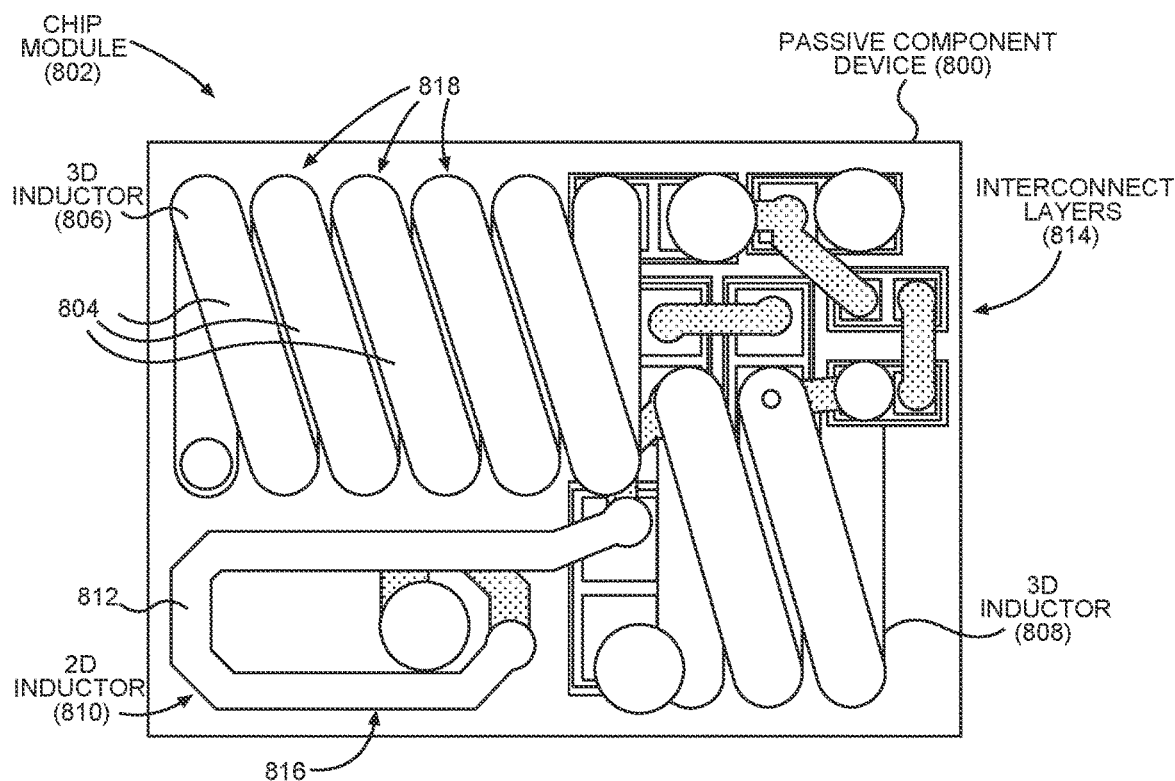
FIG. 8 is a bottom plan view of an exemplary chip module including a plurality of 3D coils extending between a metallization structure and a passive component device that includes a spiral 2D inductor formed in an interconnect layer.

FIG. 8 is a bottom plan view of a portion of a passive component device 800 in a chip module 802 in which conductive traces 804 are the only visible portions of a metallization structure that is not otherwise shown. The passive component device 800 includes 3D inductors 806 and 808, and also includes a 2D inductor 810. The 2D inductor 810 is a spiral conductive trace 812 in one of a plurality of interconnect layers 814. Although the 2D inductor 810 is primarily formed in one interconnect layer 814 of the passive component device 800, the 2D inductor 810 occupies more area of the passive component device 800 for a single turn 816 than is occupied by multiple turns 818 of the 3D inductor 806. Thus, FIG. 8 illustrates the area savings afforded by employing the 3D inductors 806 and 808 in filters in which a high inductance is needed. However, some filters require both a lower level of inductance provided by the 2D inductor 810 and a higher inductance provided by the 3D inductors 806 and 808.

Figure 9:
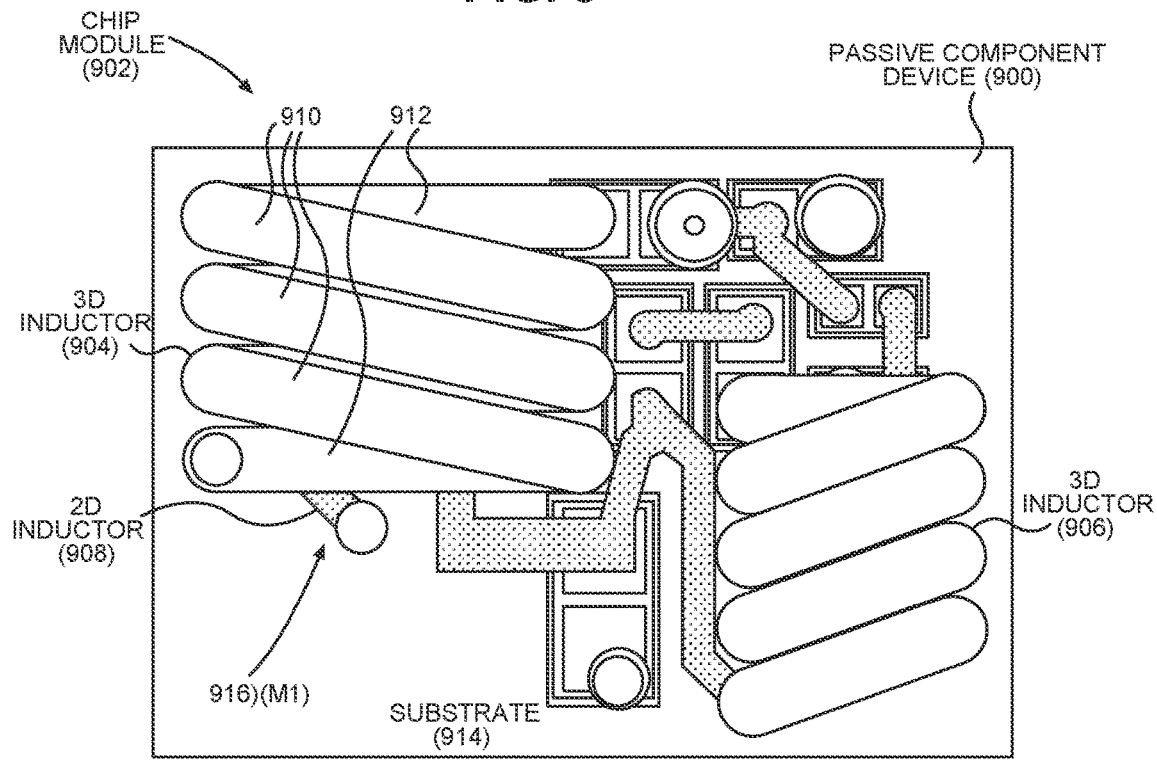
FIG. 9 is a bottom plan view of an exemplary chip module in which a spiral 2D inductor is formed in an interconnect layer of the passive component device above the interconnect layer including conductive traces of the 3D coil inductor to reduce an area of the chip module compared to the chip module of FIG. 8.

FIG. 9 is bottom plan view of a passive component device 900 in a chip module 902 similar to the chip module 802 of FIG. 8. Here, the chip module 902 has passive components 904, 906, and 908 formed from conductive traces 910 of a metallization structure that is not otherwise shown, and conductive traces 912 in a dielectric structure (not shown) of the passive component device 900. The chip module 902 differs from the chip module 802 in FIG. 8 in part because, unlike the 2D inductor 810, the 2D inductor 908 is disposed between the 3D inductor 904 and a substrate 914 in an upper interconnect layer 916 (e.g., M3). In the passive component device 900, the conductive traces 912 forming the 3D inductor 904 are in a lower interconnect layer 916 farther from the substrate 914 (e.g., M4) and not in the interconnect layers 916 between the 3D inductor 904 and the substrate 914. Since the 2D inductor 908 primarily occupies only one interconnect layer 916, the 2D inductor 908 is disposed between the 3D inductor 904 and the substrate 914 to more efficiently use the area of the chip module 902. Accordingly, the chip module 902 may provide the function of the chip module 802 in a smaller area than the chip module 802 of FIG. 8.

Figure 10:
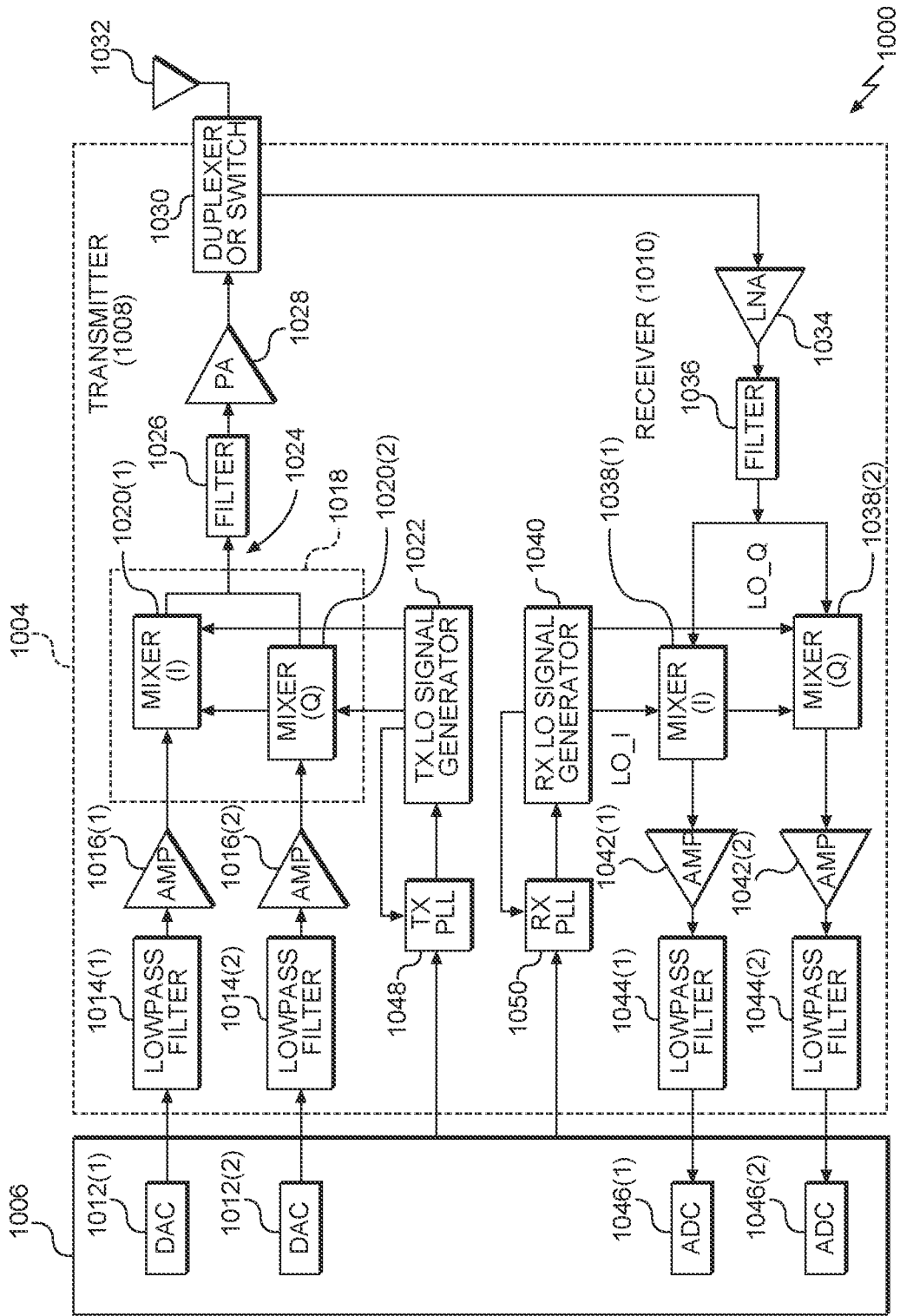
FIG. 10 is a block diagram of an exemplary wireless communications device that includes a radio frequency (RF) module such as the chip module in FIGS. 2-4, 7A-7B, 8, and 9.

FIG. 10 illustrates an exemplary wireless communications device 1000 that includes radio frequency (RF) components formed from one or more ICs 1002, wherein any of the ICs 1002 can include a chip module including conductive pillars serially coupling at least one conductive trace in an interconnect layer of a passive component device and at least one conductive trace of a redistribution layer of a metallization structure to form a high-density 3D coil of an inductor with a core region between the metallization structure and the passive component device, as illustrated in any of FIGS. 2-4, 7A-7B, 8, and 9, and according to any of the aspects disclosed herein. The wireless communications device 1000 may include or be provided in any of the above-referenced devices, as examples. As shown in FIG. 10, the wireless communications device 1000 includes a transceiver 1004 and a data processor 1006. The data processor 1006 may include a memory to store data and program codes. The transceiver 1004 includes a transmitter 1008 and a receiver 1010 that support bi-directional communications. In general, the wireless communications device 1000 may include any number of transmitters 1008 and/or receivers 1010 for any number of communication systems and frequency bands. All or a portion of the transceiver 1004 may be implemented on one or more analog ICs, RFICs (RFICs), mixed-signal ICs, etc.

The transmitter 1008 or the receiver 1010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1010. In the direct-conversion architecture, a signal is frequency-converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides I and Q analog output signals to the transmitter 1008. In the exemplary wireless communications device 1000, the data processor 1006 includes digital-to-analog converters (DACs) 1012(1), 1012(2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired signals caused by the prior digital-to-analog conversion. Amplifiers (AMPs) 1016(1), 1016(2) amplify the signals from the lowpass filters 1014(1), 1014(2), respectively, and provide I and Q baseband signals. An upconverter 1018 upconverts the I and Q baseband signals with I and Q transmit (TX) local oscillator (LO) signals through mixers 1020(1), 1020(2) from a TX LO signal generator 1022 to provide an upconverted signal 1024. A filter 1026 filters the upconverted signal 1024 to remove undesired signals caused by the frequency upconversion as well as noise in a receive frequency band. A power amplifier (PA) 1028 amplifies the upconverted signal 1024 from the filter 1026 to obtain the desired output power level and provides a transmit RF signal. The transmit RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific receive (RX)-to-TX duplexer frequency separation, such that RX signals are isolated from TX signals. The received RF signal is amplified by the LNA 1034 and filtered by a filter 1036 to obtain a desired RF input signal. Down-conversion mixers 1038(1), 1038(2) mix the output of the filter 1036 with I and Q RX LO signals (i.e., LO_I and LO_Q) from an RX LO signal generator 1040 to generate I and Q baseband signals. The I and Q baseband signals are amplified by AMPs 1042(1), 1042(2) and further filtered by lowpass filters 1044(1), 1044(2) to obtain I and Q analog input signals, which are provided to the data processor 1006. In this example, the data processor 1006 includes ADCs 1046(1), 1046(2) for converting the analog input signals into digital signals to be further processed by the data processor 1006.

In the wireless communications device 1000 of FIG. 10, the TX LO signal generator 1022 generates the I and Q TX LO signals used for frequency upconversion, while the RX LO signal generator 1040 generates the I and Q RX LO signals used for frequency downconversion. Each LO signal is a periodic signal with a particular fundamental frequency. A TX phase-locked loop (PLL) circuit 1048 receives timing information from the data processor 1006 and generates a control signal used to adjust the frequency and/or phase of the TX LO signals from the TX LO signal generator 1022. Similarly, an RX PLL circuit 1050 receives timing information from the data processor 1006 and generates a control signal used to adjust the frequency and/or phase of the RX LO signals from the RX LO signal generator 1040.

Wireless communications devices 1000 that each include a chip module including conductive pillars serially coupling at least one conductive trace in an interconnect layer of a passive component device and at least one conductive trace of a redistribution layer of a metallization structure to form a high-density 3D coil of an inductor with a core region between the metallization structure and the passive component device, as illustrated in any of FIGS. 2-4, 7A-7B, 8, and 9, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
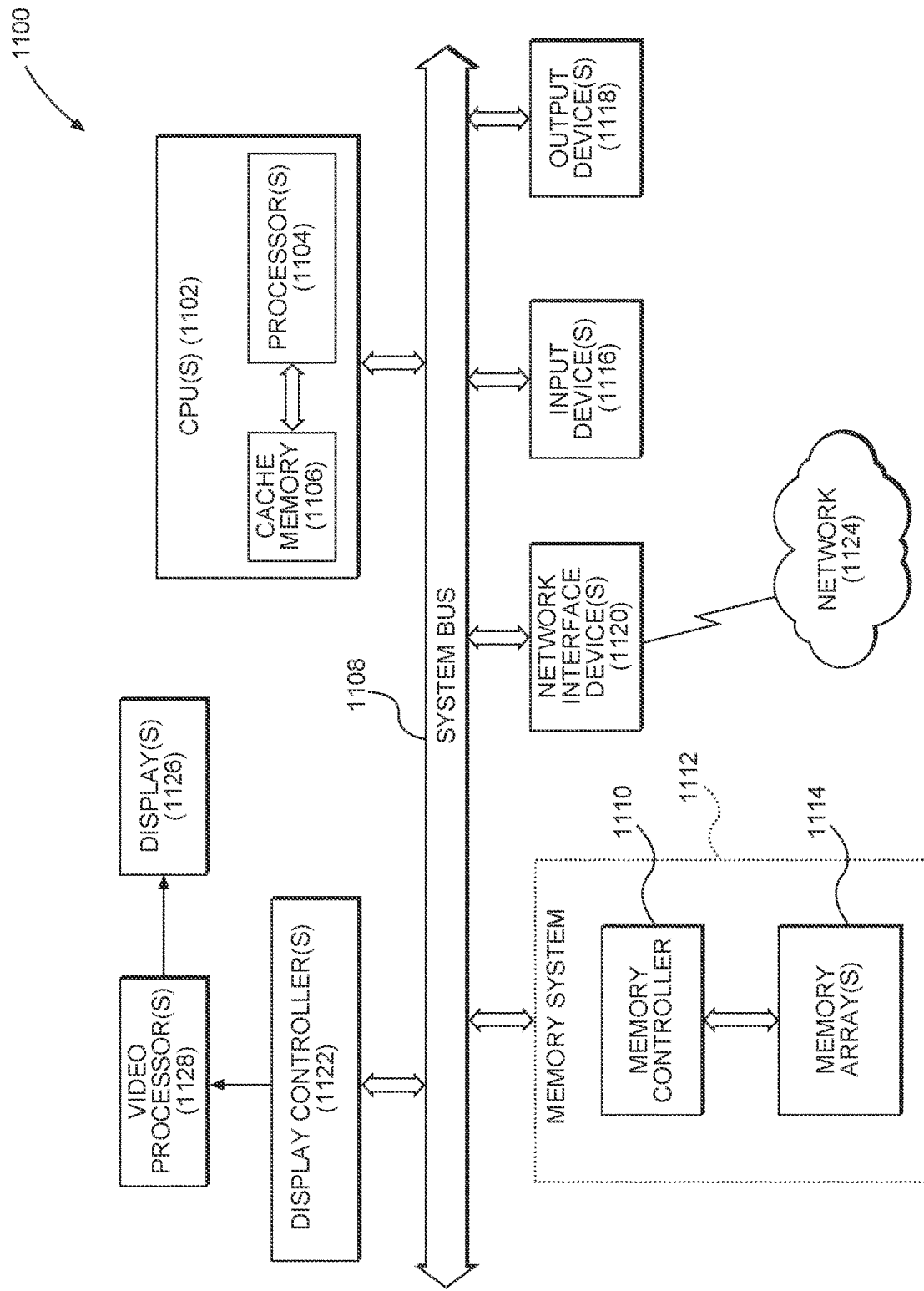
FIG. 11 is a block diagram of an exemplary processor-based system that includes a chip module including conductive pillars serially coupling at least one conductive trace in an interconnect layer of a passive component device and at least one conductive trace of a redistribution layer of a metallization structure to form a high density 3D coil of an inductor with a core region between the metallization structure and the passive component device, as illustrated in any of FIGS. 2-4, 7A-7B, 8, and 9, and according to any of the aspects disclosed herein.

In this regard, FIG. 11 illustrates an example of a processor-based system 1100 including a chip module including conductive pillars serially coupling at least one conductive trace in an interconnect layer of a passive component device and at least one conductive trace of a redistribution layer of a metallization structure to form a high-density 3D coil of an inductor with a core region between the metallization structure and the passive component device, as illustrated in any of FIGS. 2-4, 7A-7B, 8, and 9, and according to any aspects disclosed herein. In this example, the processor-based system 1100 includes one or more central processor units (CPUs) 1102, which may also be referred to as CPU or processor cores, each including one or more processors 1104. The CPU(s) 1102 may have cache memory 1106 coupled to the processor(s) 1104 for rapid access to temporarily stored data. As an example, the processor(s) 1104 could include a chip module including conductive pillars serially coupling at least one conductive trace in an interconnect layer of a passive component device and at least one conductive trace of a redistribution layer of a metallization structure to form a high-density 3D coil of an inductor with a core region between the metallization structure and the passive component device, as illustrated in any of FIGS. 2-4, 7A-7B, 8, and 9, and according to any aspects disclosed herein. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112 that includes the memory controller 1110 and one or more memory arrays 1114, one or more input devices 1116, one or more output devices 1118, one or more network interface devices 1120, and one or more display controllers 1122, as examples. Each of the memory system 1112, the one or more input devices 1116, the one or more output devices 1118, the one or more network interface devices 1120, and the one or more display controllers 1122 can include a chip module including conductive pillars serially coupling at least one conductive trace in an interconnect layer of a passive component device and at least one conductive trace of a redistribution layer of a metallization structure to form a high-density 3D coil of an inductor with a core region between the metallization structure and the passive component device, as illustrated in any of FIGS. 2-4, 7A-7B, 8, and 9, and according to any aspects disclosed herein. The input device(s) 1116 can include any type of input device, including, but not limited to, input keys, switches, voice processors, etc. The output device(s) 1118 can include any type of output device, including, but not limited to, audio, video, other visual indicators, etc. The network interface device(s) 1120 can be any device configured to allow exchange of data to and from a network 1124. The network 1124 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1120 can be configured to support any type of communications protocol desired.

The CPU(s) 1102 may also be configured to access the display controller(s) 1122 over the system bus 1108 to control information sent to one or more displays 1126. The display controller(s) 1122 sends information to the display(s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc. The display controller(s) 1122, display(s) 1126, and/or the video processor(s) 1128 can include a chip module including conductive pillars serially coupling at least one conductive trace in an interconnect layer of a passive component device and at least one conductive trace of a redistribution layer of a metallization structure to form a high-density 3D coil of an inductor with a core region between the metallization structure and the passive component device, as illustrated in any of FIGS. 2-4, 7A-7B, 8, and 9, and according to any aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A chip module comprising:
   a metallization structure comprising a first conductive trace extending between a first contact and a second contact;
   a passive component device comprising:
      a dielectric structure disposed adjacent to a substrate; and
      a second conductive trace, extending between a third contact and a fourth contact, disposed in the dielectric structure; and
   a passive component comprising:
      a first conductive pillar coupled to the first contact of the first conductive trace;
      a second conductive pillar coupling the second contact of the first conductive trace and the third contact of the second conductive trace
      a 3D inductor having a core region with an axis parallel to the metallization structure and a coil extending around an axis of the core region, a first turn of the coil, being formed by the first conductive pillar, the first conductive trace, the second conductive pillar.

2. The chip module of claim 1, wherein the 3D inductor comprises a core region between the metallization structure and the passive component device.

3. The chip module of claim 1, wherein the passive component device further comprises a metal-insulator-metal (MIM) capacitor formed in interconnect layers in the dielectric structure.

4. The chip module of claim 3, wherein the 3D inductor is coupled to the MIM capacitor in a radio-frequency (RF) signal filter.

5. The chip module of claim 1, wherein:
   the passive component device further comprises:
      a plurality of interconnect layers on the substrate; and
      a two-dimensional (2D) spiral inductor formed in the plurality of interconnect layers between the 3D inductor and the substrate; and
   the second conductive trace is one of a second plurality of conductive traces provided in the plurality of interconnect layers.

6. The chip module of claim 1, wherein:
   the first conductive trace is one of a first plurality of conductive traces;
   the first plurality of conductive traces further comprises a third conductive trace extending between a fifth contact and a sixth contact;
   the second conductive trace is one of a second plurality of conductive traces;
   the second plurality of conductive traces further comprises a fourth conductive trace extending between a seventh contact and an eighth contact;
   the at least one conductive pillar further comprises:
      a third conductive pillar coupled between the sixth contact of the third conductive trace and the seventh contact of the fourth conductive trace; and
      a fourth conductive pillar coupled to the eighth contact of the fourth conductive trace; and
   the third conductive trace, the third conductive pillar, the fourth conductive trace, and the fourth conductive pillar are coupled in series to form a second turn of the coil of the 3D inductor.

7. The chip module of claim 1, wherein a distance between the first conductive trace and the second conductive trace is at least 50 micrometers (μm).

8. The chip module of claim 6, wherein a center-to-center distance between the first conductive pillar and the third conductive pillar is at least 100 micrometers (μm).

9. The chip module of claim 1, wherein the first and second conductive pillars having a height of at least 40 micrometers (μm).

10. The chip module of claim 6, wherein:
the first conductive trace and the third conductive trace are in a first redistribution layer of the metallization structure;
the metallization structure further comprises a second redistribution layer;
the first conductive pillar, the second conductive pillar, the third conductive pillar, and the fourth conductive pillar are electrically coupled to contact regions in the second redistribution layer; and
the metallization structure further comprises vertical interconnect accesses (vias) electrically coupling the contact regions in the second redistribution layer to the first contact, the second contact, the fifth contact, and the sixth contact.

11. The chip module of claim 10, wherein:
the second conductive trace and the fourth conductive trace are in a first interconnect layer in the dielectric structure of the passive component device;
the first conductive pillar, the second conductive pillar, the third conductive pillar, and the fourth conductive pillar are electrically coupled to contact regions of a second interconnect layer of the dielectric structure; and
the passive component device further comprises vias electrically coupling the contact regions of the second interconnect layer to the third contact, the fourth contact, the seventh contact, and the eighth contact.

12. The chip module of claim 1, wherein the substrate of the passive component device comprises a glass substrate.

13. The chip module of claim 1, further comprising a radio-frequency (RF) front end module.

14. The chip module of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *